US009350293B1

(12) United States Patent
Desrochers, II et al.

(10) Patent No.: US 9,350,293 B1
(45) Date of Patent: May 24, 2016

(54) AMPLITUDE-NOISE REDUCTION SYSTEM AND METHOD FOR ULTRA-LOW PHASE-NOISE OSCILLATORS

(71) Applicant: Raytheon Company, Waltham, MA (US)

(72) Inventors: Robert E. Desrochers, II, Nashua, NH (US); Gary Ian Moore, Fremantle, WA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/598,394

(22) Filed: Jan. 16, 2015

(51) Int. Cl.
*H01P 1/20* (2006.01)
*H03B 5/18* (2006.01)

(52) U.S. Cl.
CPC ............... *H03B 5/1823* (2013.01); *H01P 1/20* (2013.01)

(58) Field of Classification Search
CPC ............................... H03B 5/1823; H01P 1/20
USPC ..................................... 331/96; 332/149, 151
See application file for complete search history.

(56) References Cited

U.S. PATENT DOCUMENTS

| | | | |
|---|---|---|---|
| 5,841,322 A | 11/1998 | Ivanov et al. | |
| 7,075,378 B2 * | 7/2006 | Howe | H03B 5/1817 331/107 DP |
| 8,125,288 B2 * | 2/2012 | Castle | H04L 27/32 332/120 |

OTHER PUBLICATIONS

Ascarrrunz, F. G., et al., "Investigations of AM and PM Noise in X-Band Devices", *1992 IEEE International Frequency Control Symposium*, (1992), 303-311.
Ashley, J. Robert, et al., "Microwave Oscillator Noise Reduction by a Transmission Stabilizing Cavity", *IEEE Transactions on Microwave Theory and Techniques*, MTT-16, No. 9, (Sep. 1968), 743-748.
Everard, J. K. A., "A Review of Low Noise Oscillator Theory and Design", *1997 IEEE International Frequency Control Symposium*, (1997), 909-918.
Green, D., et al., "A Low Phase Noise Microwave Sapphire Loop Oscillator", *2006 IEEE International Frequency Control Symposium and Exposition*, (2006), 352-860.
Hati, A., et al., "Comparison of AM Noise in Commercial Amplifiers and Oscillators at X-Band", *2006 IEEE international Frequency Control Symposium and Exposition*, (2006), 740-744.
Hati, A., et al., "Low Phase Noise Amplifier and Oscillator Using Feed-Forward Technique at 10 GHz", *2006 IEEE International Frequency Control Symposium and Exposition*, (2006), 228-232.
Rubiola, Enrico, "The Measurement of AM noise of Oscillators", *2006 IEEE International Frequency Control Symposium and Exposition*, (2006), 750-758.

* cited by examiner

*Primary Examiner* — Jeffrey Shin

(74) *Attorney, Agent, or Firm* — Schwegman Lundberg & Woessner, P.A.

(57) ABSTRACT

Embodiments of a microwave oscillator and method for amplitude noise reduction are generally described herein. The oscillator may include a resonator and an RF bridge to combine an incident and a reflected RF signal. The oscillator may further comprise an amplitude noise reduction loop, which may be configured to use a first baseband control signal to perform amplitude modulation (AM) of an oscillator feedback signal for reduction of amplitude noise on the oscillator output signal.

31 Claims, 2 Drawing Sheets

AMPLITUDE-NOISE REDUCTION SYSTEM AND METHOD FOR ULTRA-LOW PHASE-NOISE OSCILLATORS

TECHNICAL FIELD

Embodiments pertain to microwave oscillators and other microwave devices. Some embodiments relate to Sapphire Loaded Cavity Oscillators (SLCO). Some embodiments relate to amplitude noise reduction.

BACKGROUND

A microwave oscillator may produce sinusoidal and other signals at a variety of frequencies. In some applications, the oscillator output may be used to provide clock signals, reference signals or other types of control signals. Accordingly, the performance of systems using such an oscillator may depend heavily on the quality of the oscillator output. As an example, phase noise and amplitude noise in the oscillator output may affect system performance, and may even limit the performance in some cases. Accordingly, there is a general need for systems and methods that reduce such noise in microwave oscillators.

DETAILED DESCRIPTION

Figure 1:
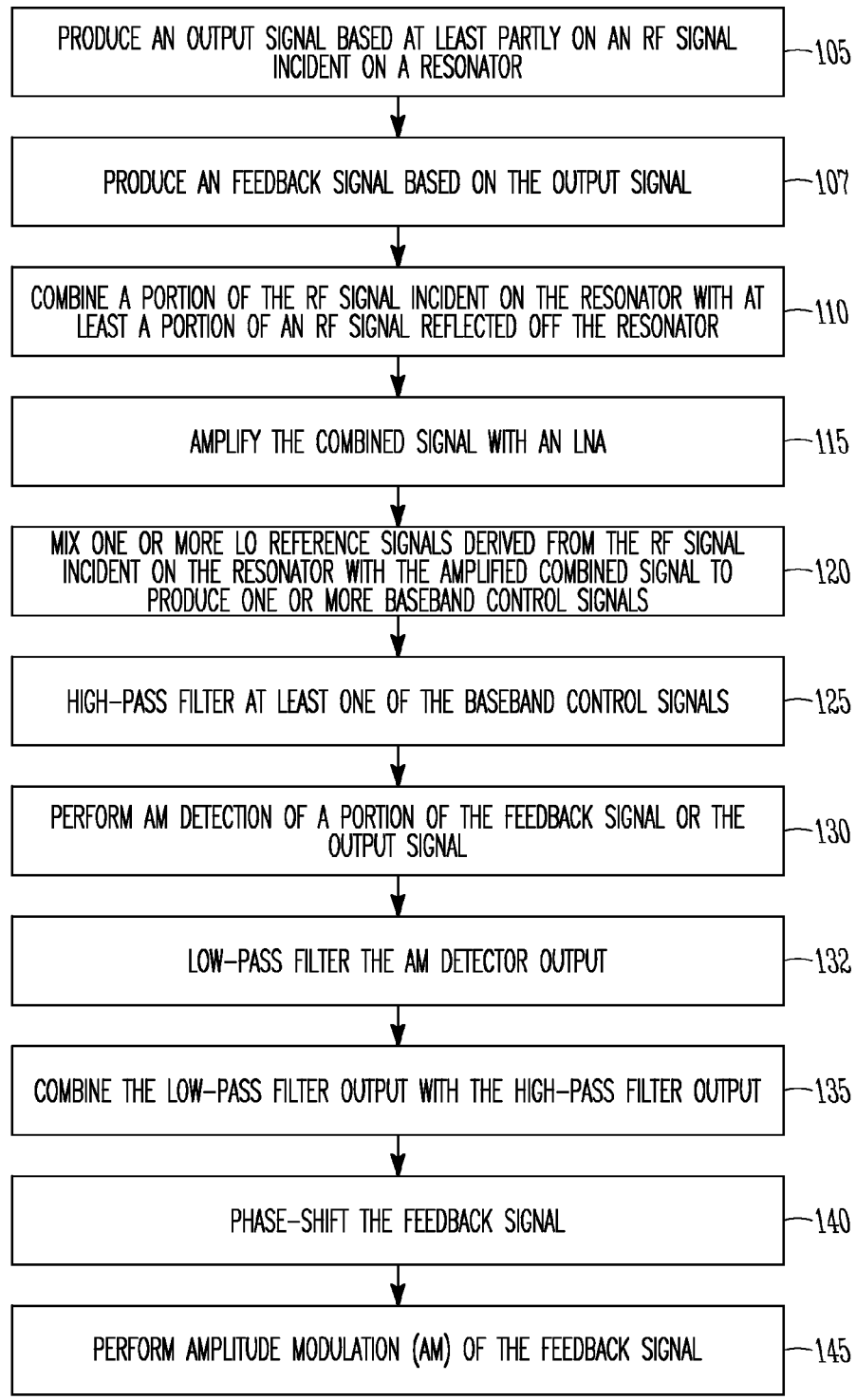
FIG. 1 illustrates the operation of an amplitude noise reduction method in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A Sapphire Loaded Cavity Oscillator (SLCO) may be used to provide high-quality output signals, such as sinusoidal or clock signals. The SLCO may produce these signals in a variety of frequency bands, including but not limited to microwave frequency bands such as the upper C-band and X-band. These signals may be used in an electronic device or system for important roles such as a master reference or a master clock. As such, quality requirements for these output signals may be quite high, and may be specified for effects such as phase noise and amplitude noise on the oscillator output. For a sinusoidal output at a particular carrier frequency, the noise power in the sidebands measured at a given frequency offset from the carrier frequency may be of interest.

In some oscillators or devices, amplifiers and other components within may produce noise that affects the phase and/or amplitude of the output signal. Accordingly, the previously described noise sidebands may include or may be affected by phase noise, amplitude noise or a combination of the two, and may also include or be affected by other noise sources or effects not described herein. As an example, an oscillator design may be affected by phase noise much more than amplitude noise, and the noise sidebands may therefore be determined largely by the phase noise. When various phase noise reduction techniques are applied to the oscillator design, the resulting phase noise may be lowered to a level at which the amplitude noise is no longer negligible. That is, the amplitude noise level may be similar to the phase noise level, and may even be higher in some cases. As an example, in an SLCO system utilizing phase noise reduction techniques such as the use of a Carrier Suppression Interferometer (CSI), amplitude noise in a frequency range between a few kHz and 100 kHz may exceed the level of reduced phase noise. This frequency range is presented as a non-limiting example, and it is understood that some or all of the techniques described herein may be applied at frequencies below and above this range. In addition, although reference may be made to microwave frequencies and/or frequency ranges, it is understood that such references are not limiting, as some or all of the techniques described herein may be applied at frequencies below and above the microwave frequencies and/or frequency ranges. As an example, some or all of the techniques described herein may be applied to optical frequencies and/or frequency ranges.

Techniques that further reduce the phase noise alone may offer limited benefit to the total noise level, which may then be limited by the amplitude noise. As such, noise reduction techniques that address the amplitude noise may be beneficial in these and other scenarios. In addition, techniques that address the simultaneous reduction of phase noise and amplitude noise may also be beneficial.

In accordance with embodiments, a microwave oscillator may use an amplitude noise reduction loop for reduction of amplitude noise on the oscillator output. In the case of a system using a CSI, the amplitude noise reduction loop may be configured to use a baseband control signal generated in the CSI to perform amplitude modulation (AM) of an oscillator feedback signal for reduction of amplitude noise on the oscillator output signal. These embodiments will be described in more detail below.

Figure 2:
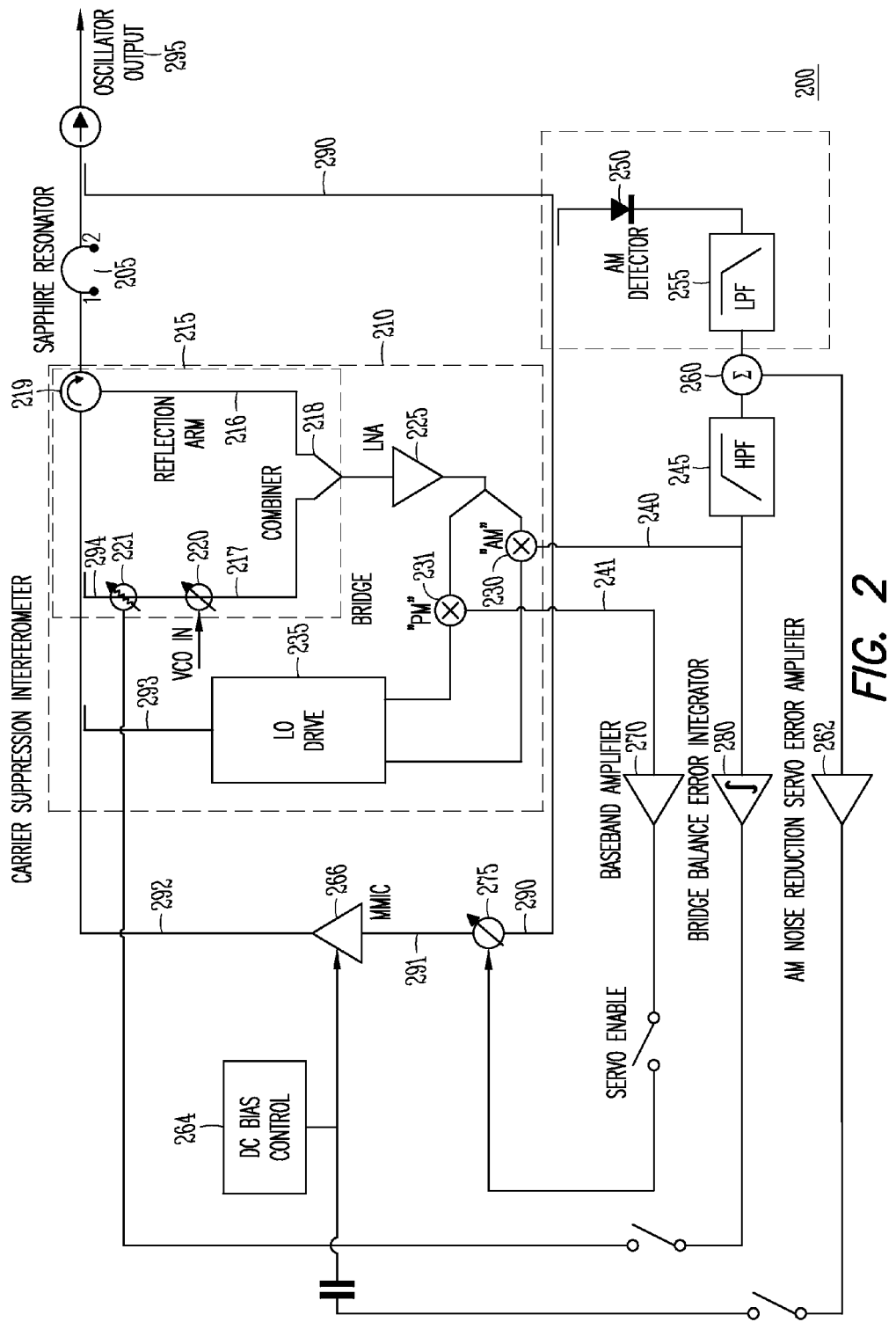
FIG. 2 illustrates a block diagram of an example microwave oscillator in accordance with some embodiments.

FIG. 1 illustrates the operation of an amplitude noise reduction method in accordance with some embodiments. FIG. 2 illustrates a block diagram of an example microwave oscillator in accordance with some embodiments. It is important to note that embodiments of the method 100 may include additional or even fewer operations or processes in comparison to what is illustrated in FIG. 1, and embodiments of the method 100 are not necessarily limited to the chronological order that is shown in FIG. 1. In describing the method 100, reference may be made to the example oscillator shown in FIG. 2, although it is understood that the method 100 may be practiced with any other suitable systems, interfaces and components. The method 100 may also be practiced on other microwave devices, and is not limited to oscillators. As another example, the microwave device may be a Radio Frequency (RF) amplifier, such as a narrow-band ultra-low-noise RF amplifier. As another example, the microwave device may be an RF filter, such as a narrow-band ultra-low-noise RF filter, which may or may not provide an amplifier gain. Such devices (RF amplifiers and RF filters) may be used to clean up a signal generated by another oscillator, in some cases. Accordingly, one or more feedback or other signals from that oscillator may be used as an input signal to the narrow-band ultra-low-noise RF amplifier or narrow-band ultra-low-noise RF filter, and some or all of the techniques and operations described herein may be used.

It should be noted that the microwave oscillator in FIG. 2 and other microwave devices may practice or may be configured to practice the method 100 or other methods, but are not so limited. Some embodiments may practice or be configured to practice some or all of the operations of the method 100 and may also practice or be configured to practice additional operations not shown in FIG. 1. In addition, some embodiments of microwave oscillators or other devices may not necessarily include all of the components shown in the example of FIG. 2, and may also include additional components not shown in the example of FIG. 2. Embodiments are also not limited to the layout or connectivity or other physical aspects shown in the example of FIG. 2. Reference may be made to the example oscillator shown in FIG. 2 for illustrative purposes during the description of operations included in the method 100, but it is understood that the method 100 and those operations described are not limited to what is shown in FIG. 2. In addition, descriptions of signals that refer to an oscillator may serve to illustrate concepts, but are not limiting. For instance, techniques or operations for an "oscillator output signal" or an "oscillator feedback signal" may also be applied to an "output signal" or "feedback signal" in other devices.

At operation 105, an output signal based at least partly on an RF signal incident on a resonator may be produced. In some embodiments, the output signal may be an oscillator output signal, but is not limited as such. Referring to the example oscillator 200 in FIG. 2, the sapphire resonator 205 may produce the oscillator output signal 295, which may be a sinusoidal signal as described earlier. In some embodiments, the resonator 205 may be a sapphire resonator, but the resonator 205 is not so limited, and other types of resonators 205 may be used. In addition, an oscillator that uses a sapphire resonator for producing an oscillator output signal may be a Sapphire Loaded Cavity Oscillator (SLCO), although not limited as such.

At operation 107, a feedback signal may be produced from the output signal. As a non-limiting example, referring to the example oscillator 200 in FIG. 2, the oscillator feedback signal 290 may be produced from the oscillator output signal 295. In some embodiments, the oscillator output signal 295 may be passed directly as the oscillator feedback signal 290, but these embodiments are not limiting. The oscillator output signal 295 may also be passed through one or more other components, such as filters, to produce the oscillator feedback signal 290. In some embodiments, the feedback signal for a device may also be based, wholly or in part, on an input signal to the device.

At operation 110, a portion of the RF signal incident on the resonator 205 may be combined with a reflection of the RF signal. Referring to the example oscillator 200 in FIG. 2, the RF bridge 215 included in the oscillator 200 may combine the incident portion and the reflection for input to mixers 230, 231. It should be noted that the combined signal may not necessarily be input directly to the mixers 230, 231, and may first be passed through a low noise amplifier (LNA) 225, or through other amplifiers, filters or other components in some cases.

It should be noted that the RF bridge output is not limited to the combination of the incident portion and the reflection as described above. In some embodiments, the RF bridge may produce an output based at least partly on a reflection of the RF signal incident on the resonator. As an example, the reflection may be combined with other signals related to the incident or output signals to produce the RF bridge output.

The RF bridge 215 may include a reference arm 217 for the portion of the RF signal incident on the resonator 205 and a reflection arm 216 for the reflection of the RF signal incident on the resonator 205. The incident portion and the reflection may be combined at the combiner 218 through summation, difference or other operation. In some embodiments, the reference arm 217 may be adjusted such that an RF carrier is canceled in the combined signal at the output of the combiner 218. Accordingly, the combined signal may be based largely on noise sidebands of the RF signal incident on the resonator 205. More particularly, information about phase and amplitude noise may be included in baseband signals resulting from down-conversion of the combined signal by the mixers 231 and 230. The reference arm 217 may be fixed or adjustable. Such adjustment may be performed manually or automatically. Automatic adjustment may be based on feedback of one or more baseband signals generated by mixers 230, 231. As a non-limiting example, FIG. 2 illustrates a method of automatic adjustment based on feedback of a baseband signal through a bridge balance error integrator 280 to a voltage variable attenuator 221. The reference arm may also include a voltage variable phase shifter 220 allowing for further control of the RF carrier cancellation at the combiner 218.

In some embodiments, the RF bridge 215 may also include a circulator 219, which may direct the reflection of the incident RF signal into the reflection arm 216. These embodiments are not limiting, however, as other components or techniques may be used for such purposes, in addition to or instead of what is shown in FIG. 2.

Although not limited as such, the RF bridge 215 and the mixers 230, 231 may be included as part of a Carrier Suppression Interferometer (CSI) 210 in some embodiments. In addition, the CSI 210 may further include other components such as the LNA 225 and a Local Oscillator (LO) drive 235 for the mixers 230, 231. Typically such an LO drive will provide one or more outputs at various phase relationships to the incident RF signal for the mixers 230, 231. In some embodiments, the reference arm 217 may include the voltage variable phase shifter 220, which may be used for carrier balance in the RF bridge 215 and also may be used for adjustment of a target carrier frequency for the oscillator output signal 295. That is, the desired output frequency of the oscillator output signal 295 may be selected from a range of values through adjustment of the voltage variable phase shifter 220.

At operation 115, the combination of the RF signal incident on the resonator 205 and the reflection of the RF signal off the resonator may be amplified with the LNA 225 to produce an amplified combined signal. As previously described, in some embodiments, the RF bridge output is not limited to this combination of the incident signal and the reflection, and may be based on the reflection in a different manner. Accordingly, the amplified combined signal may be formed through amplification of the RF bridge output with the LNA.

LO reference signals from the LO drive 235 may be mixed with the amplified combined signal to produce baseband control signals at operation 120. Referring to the example oscillator in FIG. 2, the signal out of the combiner 218 may be input to the LNA 225 and further input to the mixers 230, 231. It should be noted that the LO reference signals to mixers 230, 231 may include two signals configured 90 degrees out of phase with each other to produce baseband signals representative of, respectively, amplitude noise and phase noise sidebands in the incident RF signal. In some embodiments, the LO reference signals input to the mixers 230, 231 may be configured or adjusted in any suitable manner, including the 90 degree phase shift just described, so that the baseband signal 240 represents, or includes information about, the amplitude noise sidebands and so that the baseband signal 241 represents, or includes information about, the phase noise sidebands. It will also be understood that information about noise in any of the CSI component parts will be contained in said baseband signals.

As described earlier, the baseband control signal 240 may be related to or may be a function of amplitude noise on the oscillator output signal 295, or may include information about the amplitude noise, at least over some ranges of sideband frequencies. Therefore, the baseband control signal 240 will be referred to as the amplitude modulation (AM) signal 240. Accordingly, an amplitude noise reduction loop included in the oscillator may receive the AM signal 240. A goal of the amplitude noise reduction loop may be to perform amplitude modulation of an oscillator feedback signal in order to reduce amplitude noise on the oscillator output signal 295.

At operation 125, the AM signal 240 may be input to a high-pass filter (HPF) 245. At operation 130, AM detection of a portion of the feedback signal or the output signal may be performed at the AM detector 250. As an example, the oscillator feedback signal 290 or the oscillator output signal 295 may be used. At operation 132 the AM detector output may be input to a low-pass filter (LPF) 255. At operation 135, the output of the LPF 255 may be combined with the output of the HPF 245. The combination may be performed at a simple combiner 260. In some embodiments the combiner 260 may include a cross-over network as an alternative to HPF 245 and LPF 255.

It should be noted that some or all of operations 125-135 (or other operations) may be performed as part of the amplitude noise reduction loop, and multiple variations are possible. In some embodiments, the output of the HPF 245 may be input directly to the AM noise reduction servo error amplifier 262, in which case the AM detector 250 and/or combiner 260 may not be present or may not be used or their outputs may be bypassed. In some embodiments, the combiner 260 output (including a sum or combination of the output of the HPF 245 and the output of the AM detector 250) may be input to the AM noise reduction servo error amplifier 262. In such cases, usage of the combiner 260 output may enable amplitude noise reduction over a larger frequency range than with the HPF 245 output alone. The AM noise reduction servo error amplifier 262 output may be combined with an output of a bias control voltage source 264 to form a MMIC control signal for input to a MMIC 266, which may amplitude modulate a MMIC input signal 291 accordingly.

In some embodiments, the MMIC input signal 291 may be or may be based on a direct feedback of the oscillator output signal 295 or a portion thereof. Accordingly, the MMIC input signal 291 may be a feedback signal in some embodiments, although this is not a requirement and the scope of the embodiments is not limited in this respect. These embodiments are not limiting, however, as the feedback of the oscillator output signal 295 may pass through other components or may be affected by other operations before input to the MMIC 266 in some embodiments. As an example, the MMIC input signal 291 input to the MMIC 266 may have previously been modified by a phase noise reduction loop, as will be described below.

In some embodiments, the MMIC input signal 291 may be, or may be based on, one or more signals that are not resonator output signals or oscillator output signals. As described earlier regarding the examples of the narrow-band ultra-low-noise RF amplifier and the narrow-band ultra-low-noise RF filter, in some cases a signal from another device may be input for use as, or in the same role as, the feedback signal described.

A phase noise reduction loop may perform phase-shifting of an oscillator output or oscillator feedback signal in order to reduce phase noise on the oscillator output signal 295. As previously described, the baseband control signal 241 may include information regarding the phase noise of the oscillator output signal 295, and therefore the baseband control signal 241 will be referred to as the PM signal 241. The PM signal 241 may be used by the phase noise reduction loop. Accordingly, the phase noise reduction loop may receive the PM signal 241 from the mixer 131 and may pass the PM signal 241 through a baseband amplifier 270 for input to a phase-shifter 275. In some embodiments, the oscillator feedback signal 290, input to the phase-shifter 275, may be, or may include, a direct feedback of the oscillator output signal 295 or a portion thereof. These embodiments are not limiting, however, as the feedback of the oscillator output signal 295 may pass through other components or may be affected by other operations before input to the phase-shifter 275 in some embodiments.

At operation 140, the feedback signal may be phase-shifted by the phase-shifter 275. At operation 145, amplitude modulation of the feedback signal may be performed. As an example, the oscillator feedback signals 290, or the MMIC input signal 291, may be used in these operations. It should be noted that the oscillator feedback signal 290, and the MMIC input signal 291 may be, but are not limited to being, the same signal in some embodiments, as will be described below.

The phase noise reduction loop and amplitude noise reduction loop may operate cooperatively, which may be in a sequential or joint manner. As an example, the oscillator feedback signal 290 may be phase-shifted to produce a phase-shifted signal for input to the amplitude noise reduction loop as the MMIC input signal 291. The MMIC 266 may perform amplitude modulation on the MMIC input signal 291 to produce an updated RF signal 292 for reception at the resonator 205 to produce an updated oscillator output signal 295. Accordingly, the updated RF signal 292 may have been modified for reduction of both phase and amplitude noise in two operations. However, these embodiments are not limiting, as the amplitude modulation and phase-shifting may be performed jointly or in a different order in some embodiments. In addition, in some embodiments, the phase noise reduction loop as described may be bypassed, not used or not present, or other phase noise reduction techniques may be employed.

It should be noted that the baseband control signals 240, 241 may be associated with amplitude noise sidebands and phase noise sidebands in some embodiments, which may depend on the configuration of the LO signals output from the LO drive 235 into the mixers 230, 231. Such embodiments are not limiting, however, as the LO drive 235 may be configured in another manner to produce baseband control signals 240, 241 that may be related to the amplitude noise sidebands and phase noise sidebands in a different manner than described above.

It should be noted that embodiments of the microwave oscillator or other microwave devices may be included in stand-alone devices or components that output or produce sinusoidal, clock, control or other signals as previously described, but are not limited as such. Embodiments may also be included as part of higher level devices, such as transmitters, receivers or transceivers. As an example, a transceiver may transmit RF signals in the microwave frequency range by up-converting baseband information or other signals using the signal from the oscillator. The transceiver may also down-convert RF signals for demodulation or other processing using the signal from the oscillator. As previously described, descriptions of techniques and devices may reference microwave frequencies and/or frequency ranges, but are not limited as such. The techniques and devices may be practiced at or may operate at other frequencies and/or frequency ranges in some cases.

As an example, a communication device may include a processor that may be configured to form a baseband signal that is based at least partly on a group of information bits, such as a packet of bits. The baseband signal may be formed through various transmitter and encoding functions used in communication systems, such as error correction coding and modulation. The communication device may also include the oscillator and may use it to translate the baseband signal to an appropriate microwave or other RF frequency range for transmission. In addition, reception of similar signals may be employed by the communication device using the oscillator for down-conversion of an RF signal to baseband and further using the processor for demodulation and decoding operations to produce information bits.

As another example, a radar device may also include a processor that may be configured to generate a known baseband signal or pattern designed for radar applications. The baseband signal may be translated, using the oscillator, to the microwave frequency range for transmission. In addition, a received signal, such as a response or a reflection of the transmitted signal, may be received by the radar device for further processing, which may be performed on a baseband signal produced through down-conversion of the received signal by the oscillator.

Embodiments may be included as part of radar or communication systems or other systems in any suitable form, including usage as an integrated device. As another example, test equipment and signal generators that produce or use the sinusoidal, clock or control signals previously described may also include embodiments described herein in any suitable form, including usage as an integrated device. These examples are presented to illustrate applications or use of some embodiments, but they are certainly not limiting, as embodiments described herein may be included or employed in a variety of other devices and systems.

A microwave device configured to produce an output signal in a microwave frequency range is disclosed herein. The microwave device may comprise a resonator to receive an incident radio frequency (RF) signal for producing the output signal. The microwave device may further comprise an RF bridge to produce an output based at least partly on a reflection of the RF signal incident on the resonator. The microwave device may further comprise one or more mixers to receive an input signal based at least partly on the RF bridge output. In some embodiments, the RF bridge output may include a combination of a portion of the RF signal incident on the resonator with a reflection of the RF signal incident on the resonator. The microwave device may further comprise an amplitude noise reduction loop, which may be configured to receive a first baseband control signal that is based at least partly on a first mixer output, the first baseband control signal related to amplitude noise sidebands of the RF signal incident on the resonator. Baseband control signals output from the mixers may include signals representative of phase noise sidebands or amplitude noise sidebands in the output, and may be referred to as PM and AM baseband signals respectively, or signals representative of some combination of the phase noise and amplitude noise sidebands in the output. Said combination may be variable according to the offset frequency of the noise sidebands. Accordingly, the first baseband control signal may be an AM baseband signal as described. The amplitude noise reduction loop may be further configured to perform amplitude modulation (AM) of a feedback signal to produce an updated RF signal for reception at the resonator to produce an updated output signal. In some embodiments, the AM of the feedback signal may be based at least partly on an AM baseband control signal.

In some embodiments, the feedback signal may be based at least partly on a feedback of the output signal from the resonator. In some embodiments, the AM of the feedback signal may be based at least partly on an output of a high-pass filter when the first baseband control signal is input to the high-pass filter. In some embodiments, the AM of the feedback signal may be further based at least partly on a sum of the high-pass filter output and an output of an AM detector when a portion of the feedback signal is input to the AM detector. In some embodiments, the AM of the feedback signal may be based at least partly on the output of a low-pass filter when the output of the AM detector is input to the low-pass filter. In some embodiments, the sum may be performed by a cross-over network. In some embodiments, the AM of the feedback signal may be performed at least partly by a Monolithic Microwave Integrated Circuit (MMIC) and a bias control voltage source.

The microwave device may further comprise a phase noise reduction loop configured to receive a second baseband control signal from the mixers that is related to phase noise sidebands of the RF signal incident on the resonator and phase shift, based at least partly on the second baseband control signal, the feedback signal to produce the updated output signal. In some embodiments, the RF bridge and the one or more mixers may be included as part of a Carrier Suppression Interferometer (CSI), the CSI further comprising an RF Low Noise Amplifier (LNA) and a Local Oscillator (LO) drive for the one or more mixers. In some embodiments, the RF bridge may comprise a reference arm for a portion of the RF signal incident on the resonator and a reflection arm for at least a portion of the reflection of the RF signal incident on the resonator. In some embodiments, the reference arm may include a Voltage Controlled Oscillator (VCO) input to a voltage variable phase shifter for adjustment of a target carrier frequency for the output signal.

In some embodiments, the RF bridge may further comprise a circulator or another component to direct the reflected RF signal into the reflection arm. In some embodiments, the first baseband control signal may be used to control, or may form the basis of, an input to a voltage variable attenuator in the reference arm of the RF bridge for maintenance of carrier amplitude balance between the reference arm and reflection arm of the RF bridge. In some embodiments, the microwave device may be a microwave oscillator. The output signal may be an oscillator output signal and the feedback signal may be an oscillator feedback signal. In some embodiments, the microwave oscillator may be a Sapphire Loaded Cavity Oscillator (SLCO) and the resonator may be a sapphire resonator. In some embodiments, the microwave device may be an RF amplifier. In some embodiments, the microwave device may be a filter. In some embodiments, the microwave device may be an RF filter.

A method of reducing amplitude noise at a microwave oscillator is also disclosed herein. The method may comprise producing an oscillator output signal based at least partly on a radio frequency (RF) signal incident on a resonator and combining a portion of the RF signal incident on the resonator with a reflection of the RF signal incident on the resonator to produce an RF bridge output signal. The method may further comprise mixing a first local oscillator (LO) reference signal with a mixer input signal to produce a first baseband control signal, the mixer input signal based at least partly on the RF bridge output signal. The first baseband control signal may be an AM baseband signal, as previously described. The method may further comprise performing amplitude modulation (AM) of an oscillator feedback signal to produce an updated RF signal for reception at the resonator. In some embodiments, the AM of the oscillator feedback signal may be based at least partly on the first baseband control signal. In some embodiments, the oscillator feedback signal may be based at least partly on a feedback of the oscillator output signal from the output of the resonator. The method may further comprise high-pass filtering the first baseband control signal for use in the AM of the oscillator feedback signal. The method may further comprise performing AM detection of a portion of the oscillator feedback signal for use in the AM of the oscillator feedback signal. The method may further comprise mixing a second LO reference signal with the mixer input signal to produce a second baseband control signal. The method may further comprise phase-shifting, based at least partly on the second baseband control signal, the oscillator feedback signal to produce the updated RF signal. In some embodiments, the microwave oscillator may be a Sapphire Loaded Cavity Oscillator (SLCO) and the resonator may be a sapphire resonator.

A transceiver configured to transmit or receive signals in a microwave frequency range is also disclosed herein. The transceiver may comprise a low noise amplifier (LNA) for amplification of signals in the microwave frequency range. The transceiver may further comprise an oscillator for translating signals between a baseband frequency range and the microwave frequency range. The oscillator may comprise a resonator to receive an incident radio frequency (RF) signal for producing the oscillator output signal. The oscillator may further comprise an RF bridge to combine a portion of the RF signal incident on the resonator with a reflection of the RF signal incident on the resonator for input to one or more mixers. The oscillator may further comprise an amplitude noise reduction loop configured to receive a first baseband control signal that includes an output of the mixers when the combined signal from the RF bridge is input to the mixers. In some embodiments, the first baseband control signal may be produced, at least in part, from an output of the mixers when the combined signal from the RF bridge is input to the mixers. In some embodiments, the first baseband control signal may include information about, or may be related to, amplitude noise sidebands as previously described.

The amplitude noise reduction loop may be further configured to perform amplitude modulation (AM) of an oscillator feedback signal to produce an updated RF signal for reception at the resonator to produce an updated oscillator output signal. In some embodiments, the AM of the oscillator feedback signal may be based at least partly on the first baseband control signal. In some embodiments, the oscillator feedback signal may be based at least partly on a feedback of the oscillator output signal from the resonator. In some embodiments, the AM of the oscillator feedback signal may be based at least partly on an output of a high-pass filter when the first baseband control signal is input to the high-pass filter. In some embodiments, the AM of the oscillator feedback signal may be further based at least partly on a sum of the high-pass filter output and an output of an AM detector when a portion of the oscillator feedback signal is input to the AM detector. In some embodiments, the AM of the oscillator feedback signal may be performed at least partly by a Monolithic Microwave Integrated Circuit (MMIC) and a bias control voltage source.

The transceiver may further comprise a processor, which may be configured to generate a baseband information signal for translation, by the oscillator, to the microwave frequency range for transmission. The baseband information signal may be based at least partly on a group of information bits.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A microwave device configured to produce an output signal in a microwave frequency range, the microwave device comprising:
    a resonator to receive an incident radio frequency (RF) signal for producing the output signal;
    an RF bridge to produce an output based at least partly on a reflection of the RF signal incident on the resonator;
    one or more mixers to receive an input signal based at least partly on the RF bridge output; and
    an amplitude noise reduction loop configured to:
        receive a first baseband control signal that is based at least partly on a first mixer output, the first baseband control signal related to amplitude noise sidebands of the RF signal incident on the resonator;
        perform amplitude modulation (AM) of a feedback signal to produce an updated RF signal for reception at the resonator to produce an updated output signal; and
        wherein the AM of the feedback signal is based at least partly on the first baseband control signal.

2. The microwave device according to claim 1, wherein the output of the RF bridge includes a combination of a portion of the RF signal incident on the resonator with a reflection of the RF signal incident on the resonator.

3. The microwave device according to claim 1, wherein the microwave device is a microwave oscillator and the output signal is an oscillator output signal.

4. The microwave device according to claim 3, wherein the microwave oscillator is a Sapphire Loaded Cavity Oscillator (SLCO) and the resonator is a sapphire resonator.

5. The microwave device according to claim 1, wherein the microwave device is an RF filter.

6. The microwave device according to claim 1, wherein the feedback signal is based at least partly on a feedback of the output signal from the resonator.

7. The microwave device according to claim 6, wherein the AM of the feedback signal is based at least partly on an output of a high-pass filter when the first baseband control signal is input to the high-pass filter.

8. The microwave device according to claim 7, wherein the AM of the feedback signal is further based at least partly on a sum of the high-pass filter output and an output of an AM detector when a portion of the feedback signal is input to the AM detector.

9. The microwave device according to claim 8, wherein the sum is performed by a cross-over network.

10. The microwave device according to claim 7, wherein the AM of the feedback signal is performed at least partly by a Monolithic Microwave Integrated Circuit (MMIC) and a bias control voltage source.

11. The microwave device according to claim 6, further comprising a phase noise reduction loop configured to:
    receive a second baseband control signal from the mixers that is related to phase noise sidebands of the RF signal incident on the resonator; and
    phase shift, based at least partly on the second baseband control signal, the feedback signal to produce the updated output signal.

12. The microwave device according to claim 11, wherein the amplitude noise reduction loop and the phase noise reduction loop enable simultaneous and automatic reduction of amplitude noise and phase noise of the updated output signal.

13. The microwave device according to claim 1, wherein the RF bridge and the mixers are included as part of a Carrier Suppression Interferometer (CSI), the CSI further comprising an RF Low Noise Amplifier (LNA) and a Local Oscillator (LO) drive for the mixers.

14. The microwave device according to claim 13, wherein the RF bridge comprises a reference arm for the portion of the RF signal incident on the resonator and a reflection arm for the reflection of the RF signal incident on the resonator.

15. The microwave device according to claim 14, wherein the reference arm includes a Voltage Controlled Oscillator (VCO) input to a voltage variable phase shifter for adjustment of a target carrier frequency for the output signal.

16. The microwave device according to claim 14, wherein the RF bridge further comprises a circulator to direct the reflection of the incident RF signal into the reflection arm.

17. The microwave device according to claim 14, wherein the first baseband control signal is further used to control a voltage variable attenuator in the reference arm of the RF bridge for maintenance of carrier amplitude balance between the reference arm and reflection arm of the RF bridge.

18. A method of reducing amplitude noise at a microwave oscillator, the method comprising:
produce an oscillator output signal based at least partly on a radio frequency (RF) signal incident on a resonator;
combining a portion of the RF signal incident on the resonator with a reflection of the RF signal incident on the resonator to produce an RF bridge output signal;
mixing a first local oscillator (LO) reference signal with a mixer input signal to produce a first baseband control signal, the mixer input signal based at least partly on the RF bridge output signal; and
performing amplitude modulation (AM) of an oscillator feedback signal to produce an updated RF signal for reception at the resonator;
wherein the AM of the oscillator feedback signal is based at least partly on the first baseband control signal.

19. The method according to claim 18, wherein the oscillator feedback signal is based at least partly on a feedback of the oscillator output signal from the output of the resonator.

20. The method according to claim 19, further comprising high-pass filtering the first baseband control signal for use in the AM of the oscillator feedback signal.

21. The method according to claim 20, further comprising performing AM detection of a portion of the oscillator feedback signal for use in the AM of the oscillator feedback signal.

22. The method according to claim 19, further comprising:
mixing a second LO reference signal with the mixer input signal to produce a second baseband control signal; and
phase-shifting, based at least partly on the second baseband control signal, the oscillator feedback signal to produce the updated RF signal.

23. The method according to claim 18, wherein the microwave oscillator is a Sapphire Loaded Cavity Oscillator (SLCO) and the resonator is a sapphire resonator.

24. A transceiver configured to transmit or receive signals in a microwave frequency range, comprising:
a low noise amplifier (LNA) for amplification of signals in the microwave frequency range; and
an oscillator for translating signals between a baseband frequency range and the microwave frequency range, the oscillator comprising:
a resonator to receive an incident radio frequency (RF) signal for producing an oscillator output signal for use in the translation;
an RF bridge to combine a portion of the RF signal incident on the resonator with a reflection of the RF signal incident on the resonator for input to one or more mixers; and
an amplitude noise reduction loop to:
receive a first baseband control signal that includes an output of the mixers when the combined signal from the RF bridge is input to the mixers;
perform amplitude modulation (AM) of an oscillator feedback signal to produce an updated RF signal for reception at the resonator to produce an updated oscillator output signal; and
wherein the AM of the oscillator feedback signal is based at least partly on the first baseband control signal.

25. The transceiver according to claim 24, wherein the oscillator feedback signal is based at least partly on a feedback of the oscillator output signal from the resonator.

26. The transceiver according to claim 25, wherein the AM of the oscillator feedback signal is based at least partly on an output of a high-pass filter when the first baseband control signal is input to the high-pass filter.

27. The transceiver according to claim 26, wherein the AM of the oscillator feedback signal is further based at least partly on a sum of the high-pass filter output and an output of an AM detector when a portion of the oscillator feedback signal is input to the AM detector.

28. The transceiver according to claim 26, wherein the AM of the oscillator feedback signal is performed at least partly by a Monolithic Microwave Integrated Circuit (MMIC) and a bias control voltage source.

29. The transceiver according to claim 24, further comprising a processor configured to generate a baseband information signal for translation, by the oscillator, to the microwave frequency range for transmission, wherein the baseband information signal is based at least partly on a group of information bits.

30. The transceiver according to claim 25, wherein the oscillator further comprises a phase noise reduction loop configured to:
receive a second baseband control signal from the mixers that is related to phase noise sidebands of the RF signal incident on the resonator; and
phase shift, based at least partly on the second baseband control signal, the oscillator feedback signal to produce the updated oscillator output signal.

31. The transceiver according to claim 30, wherein the amplitude noise reduction loop and the phase noise reduction loop enable simultaneous and automatic reduction of amplitude noise and phase noise of the updated oscillator output signal.

* * * * *